(12) United States Patent
Zhang

(10) Patent No.: US 9,510,480 B2
(45) Date of Patent: Nov. 29, 2016

(54) ELECTRONIC DEVICE

(71) Applicants: Beijing Lenovo Software Ltd., Beijing (CN); Lenovo (Beijing) Co., Ltd., Beijing (CN)

(72) Inventor: Guowen Zhang, Beijing (CN)

(73) Assignees: Beijing Lenovo Software Ltd., Beijing (CN); Lenovo (Beijing) Co., Ltd., Beijing (CN)

( * ) Notice: Subject to any disclaimer, the term of this patent is extended or adjusted under 35 U.S.C. 154(b) by 245 days.

(21) Appl. No.: 14/094,404

(22) Filed: Dec. 2, 2013

(65) Prior Publication Data

US 2014/0153190 A1 Jun. 5, 2014

(30) Foreign Application Priority Data

Dec. 3, 2012 (CN) ............ 2012 1 0510140

(51) Int. Cl.
*H05K 7/20* (2006.01)
*F04D 29/00* (2006.01)

(52) U.S. Cl.
CPC ............ *H05K 7/20172* (2013.01); *F04D 29/00* (2013.01)

(58) Field of Classification Search
CPC ............... H05K 7/20136; H05K 7/20172; H05K 7/202; H05K 7/20209; H05K 7/20554; H05K 7/20718; H05K 7/20727; H05K 7/20736; H05K 7/20745; H05K 7/20754; H05K 7/20909; H05K 7/20918; F04D 33/00
USPC ....... 361/679.46–679.48, 694–697; 165/908; 310/36–39, 311–371
See application file for complete search history.

(56) References Cited

U.S. PATENT DOCUMENTS 4,063,826 A * 12/1977 Riepe .................. F04D 33/00
417/410.1
5,104,626 A * 4/1992 Yang .................. A61L 9/12
261/DIG. 88

(Continued)

FOREIGN PATENT DOCUMENTS

| CN | 101370373 A | 2/2009 |
| CN | 202043412 U | 11/2011 |
| JP | 2010278681 A | 12/2010 |

OTHER PUBLICATIONS

First Chinese Office Action regarding Application No. 201210510140.4 dated Feb. 1, 2016. English translation provided by Unitalen Attorneys at Law.

*Primary Examiner* — Adam B Dravininkas
(74) *Attorney, Agent, or Firm* — Harness, Dickey & Pierce, P.L.C.

(57) ABSTRACT

An electronic apparatus includes: a case; a support device arranged at the case; a rotating plate articulated to the support device; a driving device; and a heat generating device. The driving device is configured to drive the rotating plate to rotate with respect to the support device; the rotating plate rotates with respect to the support device to generate airflow, the airflow is in a direction parallel to a rotation plane of the rotating plate and away from the support device; and the heat generating device is arranged at a region that the airflow flows through and heat of the heat generating is dissipated by the airflow.

4 Claims, 11 Drawing Sheets

(56) References Cited

U.S. PATENT DOCUMENTS

| | | | | |
|---|---|---|---|---|
| 5,381,950 A * | 1/1995 | Aldridge | ............ | G05D 23/1902 236/1 R |
| 9,011,113 B2 * | 4/2015 | Ma | ............ | F04D 33/00 417/410.2 |
| 2004/0253130 A1 * | 12/2004 | Sauciuc | ............ | F04D 33/00 417/436 |
| 2007/0001550 A1 * | 1/2007 | Palanduz | ............ | F04D 33/00 310/328 |
| 2009/0072637 A1 * | 3/2009 | Chang | ............ | F04D 33/00 310/36 |
| 2009/0121567 A1 * | 5/2009 | Chou | ............ | F04D 25/0606 310/77 |
| 2010/0038994 A1 * | 2/2010 | Eichhorner | ............ | H01L 23/467 310/317 |
| 2010/0319885 A1 * | 12/2010 | Ignon | ............ | F04D 33/00 165/104.34 |
| 2011/0014069 A1 * | 1/2011 | Wada | ............ | F04D 33/00 417/410.2 |

* cited by examiner

ELECTRONIC DEVICE

CROSS REFERENCE TO RELATED APPLICATION

The present application claims the priority to Chinese Patent Application No. 201210510140.4, filed with the Chinese Patent Office on Dec. 3, 2012, entitled as "ELECTRONIC DEVICE", the entire contents of which is incorporated herein by reference in its entirety.

BACKGROUND

Field of the Disclosure

The present invention relates to the technical field of mechanical heat-dissipation, particularly to an electronic device.

Background of the Technology

Ruggedized handheld devices generally employ passive heat-dissipation solution, for example, by heating the air to push the air to flow, the hot air in the handheld device is carried to the outside of the device. However, as functions of the handheld device increase, such as the import of the Beidou system, power consumption of the entire device system significantly increases. While the excessive hot air cannot be carried out merely by the passive heat-dissipation solution, the temperature of the internal and/or surface of the handheld device is made too high. Therefore the operation of the device and user experience are affected.

SUMMARY

The technical problem to be solved by the present invention is to provide an electronic device to solve the technical problem in the prior art of inability to dissipate heat of a handheld device timely as power consumption of the handheld device increases, leading to significantly increasing of temperature of the handheld device, and affecting the operation of the device and user experience.

To solve the above technical problem, the present invention provides an electronic device, including:
  a case;
  a support device arranged at the case;
  a rotating plate articulated to the support device;
  a driving device configured to drive the rotating plate to rotate with respect to the support device; wherein the rotating plate rotates with respect to the support device to generate airflow, the airflow is in a direction parallel to a rotation plane of the rotating plate and away from the support device;
  an heat generating device arranged at a region that the airflow flows through, wherein heat of the heat generating device is dissipated by the airflow.

The above electronic device, preferably, further includes:
  an opening arranged at the case, located at a downstream of the airflow that flows through the exothermal device, and configured to export the airflow that flows through the heat generating device to the outside of the case.

In the above electronic device, preferably, the heat generating device includes:
  a first heat transferring assembly connected to an electronic component via a second heat transferring assembly and configured to receive heat transferred by the second heat transferring assembly from the electronic component.

In the above electronic device, preferably, the driving device includes:
  an swinging driver configured to drive the rotating plate to swinge to and fro with respect to the support device by taking a predetermined axis as a central line,
  where the rotating plate swings to and fro to generate airflow, and the airflow is in a direction along the axis and away from the support device.

In the above electronic device, preferably, the swinging driver includes:
  a first driver configured to drive the rotating plate to rotate with respect to the support device by taking the predetermined axis as the central line in a first predetermined direction for a first predetermined duration;
  a second driver configured to drive the rotating plate to rotate with respect to the support device by taking the predetermined axis as the central line in a direction opposite to the first predetermined direction for a second predetermined duration;
  a controller configured to alternately trigger the first driver and the second driver to generate airflow,
  wherein the airflow is in a direction parallel to the axis and away from the support device.

In the above electronic device, preferably, the swinging driver includes:
  a force generator configured to generate an action force every a third predetermined duration, wherein the action force controls the rotating plate to rotate with respect to the support device by taking the predetermined axis as the central line in a second predetermined direction for a fourth predetermined duration;
  a resetting unit configured to control the rotating plate to rotate with respect to the support device by taking the predetermined axis as the central line in a direction opposite to the second predetermined direction.

In the above electronic device, preferably, the force generator includes:
  a pulse current generator configured to generate a pulse current every the third predetermined duration, and wherein a duration of the pulse current is the fourth predetermined duration;
  a core wound at least one loop of winding, wherein two leading-out terminals of the winding are respectively connected to the pulse current generator, the core is configured to attract the rotating plate to rotate with respect to the support device every the third predetermined duration by taking the predetermined axis as the central line in the second predetermined direction for the fourth predetermined duration,
  the resetting unit includes a torsional spring configured to pull the rotating plate to rotate with respect to the support device by taking the predetermined axis as the central line in a direction opposite to the second predetermined direction.

In the above electronic device, preferably, the force generator includes:
  a pulse current generator configured to generate a pulse current every the third predetermined duration, and wherein a duration of the pulse current is the fourth predetermined duration;
  a core wound at least one loop of winding, wherein two leading-out terminals of the winding are respectively connected to the pulse current generator, the core is configured to push the rotating plate to rotate with respect to the support device every the third predetermined duration by taking the predetermined axis as the central line in the second predetermined direction for the fourth predetermined duration, the resetting unit includes a torsional spring configured to push the rotating plate to rotate with respect to the support device by taking the predetermined axis as the central line in the direction opposite to the second predetermined direction.

In the above electronic device, preferably, the case includes a first surface and a second surface, and the first surface is opposite to the second surface, an input and output device is arranged at the second surface, wherein the support device is arranged at the first surface of the case.

In the above electronic device, preferably:

the support device is arranged at a predetermined area of the first surface of the case, and the predetermined area is opposite to the area where a voice output unit of the input and output device is located.

In the above electronic device, preferably: the force generator includes:

a pulse current generator configured to generate a pulse current every the third predetermined duration, and wherein a duration of the pulse current is the fourth predetermined duration;

a core wound at least one loop of winding, wherein two leading-out terminals of the winding are respectively connected to the pulse current generator, the core is configured to push the rotating plate to rotate with respect to the support device every the third predetermined duration by taking the predetermined axis as the central line in the second predetermined direction for the fourth predetermined duration;

where, the rotating plate falls down to rotate with respect to the support device by taking the predetermined axis as the central line in the direction opposite to the second predetermined direction due to the gravity after being pushed by the core to rotate with respect to the support device every the third predetermined duration by taking a predetermined axis as the central line in the second predetermined direction for the fourth predetermined duration.

As illustrated in the above technical solution, an electronic device according to the present invention includes: a case; a support device arranged at the case; a rotating plate articulated to the support device; a driving device and an heat generating device. The driving device is configured to drive the rotating plate to rotate with respect to the support device. The rotating plate rotates with respect to the support device to generate airflow, the airflow is in a direction parallel to a rotation plane of the rotating plate and away from the support device. The heat generating device is arranged at a region that the airflow flows through and heat of the heat generating device is dissipated by the airflow. According to the present invention, the driving device is utilized to drive the rotating plate to rotate to push the air to flow to generate airflow, and the heat of the heat generating device is dissipated to the outside of the case along with the flowing of the air, thus the object to dissipate the heat of the heat generating device is achieved. Different from positive heat-dissipation devices such as fans, the device provided in the present invention is simpler, the effect of positive heat-dissipation is achieved via the airflow generated by the rotation (or swinging) of a metal sheet or film, and smaller energy is consumed. The device provided in the present invention is secure, reliable, and stable, and easily to meet the requirement of waterproofing and dustproofing. Meanwhile, compared to the requirement of the blade of the fan on the diameter dimension, the present invention is more flexible and effective in the use of space.

BRIEF DESCRIPTION OF THE DRAWINGS

For more clearly illustrating embodiments of the present invention or the technical solution in the prior art, drawings referred to describe the embodiments or the prior art will be briefly described hereinafter. Apparently, the drawings in the following description are only several embodiments of the present invention, and for the person skilled in the art other drawings may be obtained based on these drawings without any creative efforts.

DETAILED DESCRIPTION

The technical solutions in the embodiments of the present invention will be described clearly and completely hereinafter in conjunction with the drawings in the embodiments of the present invention. Apparently, the described embodiments are only a part of the embodiments of the present invention, rather than all embodiments. Based on the embodiments in the present invention, all of other embodiments, made by the person skilled in the art without any creative efforts, fall into the protection scope of the present invention.

Figure 1:
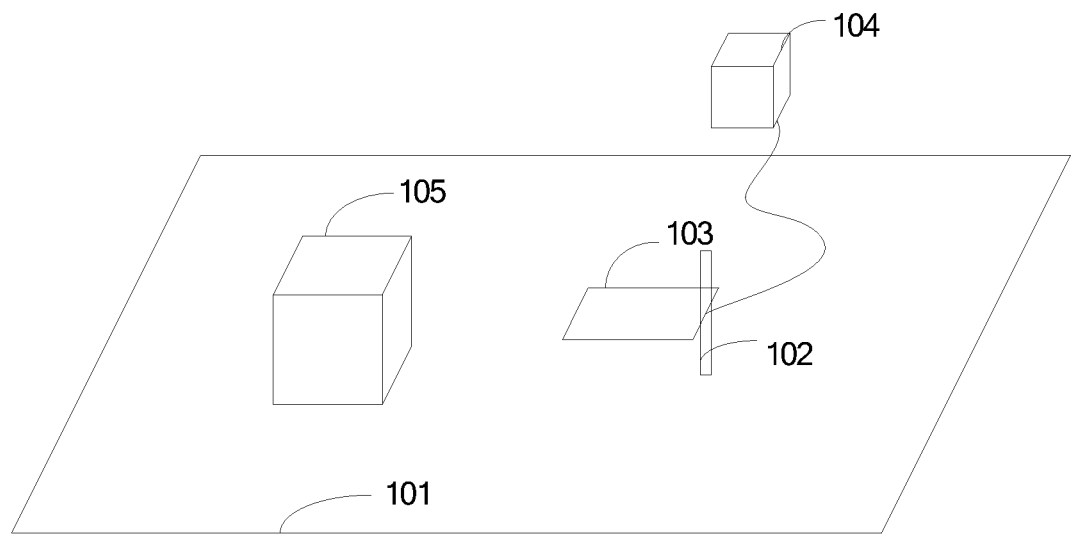
FIG. 1 is a schematic diagram showing the structure of an electronic device according to a first embodiment of the present invention.

FIG. 1 shows a schematic diagram of the structure of an electronic device according to a first embodiment of the present invention. The electronic device at least includes the following:

a case 101; a support device 102; a rotating plate 103; a driving device 104; and an heat generating device 105.

The support device 102 is arranged at the case 101.

It is to be noted that, the first embodiment of the present invention includes an electronic device such as a ruggedized handheld device, the case 101 is a case of the electronic device.

The support device 102 may be arranged at an inner side of the case 101, and may also be arranged at an outer side of the case 101. In embodiments according to the present invention, the present invention is illustrated by taking the support device 102 arranged at the inner side of the case 101 as an instance.

The rotating plate 103 is articulated to the support device 102.

Figure 2:
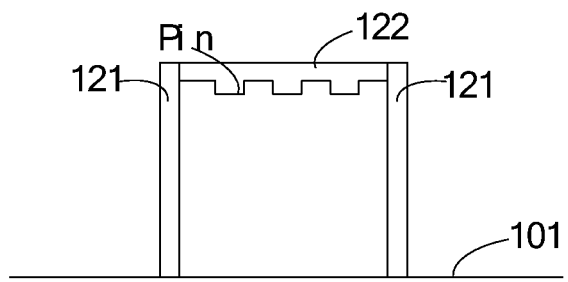
FIG. 2 is a schematic diagram showing another partial structure of the electronic device according to the first embodiment of the present invention.

Preferably, the support device 102 is a support frame including two pillars 121 and a cross arm 122 provided with a pin, as in the schematic diagram of partial structure of the embodiment of the present invention shown in FIG. 2.

Figure 3:
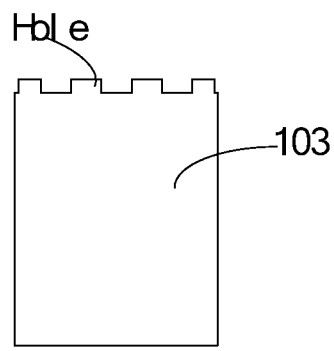
FIG. 3 is a schematic diagram showing another partial structure of the electronic device according to the first embodiment of the present invention.
Figure 4:
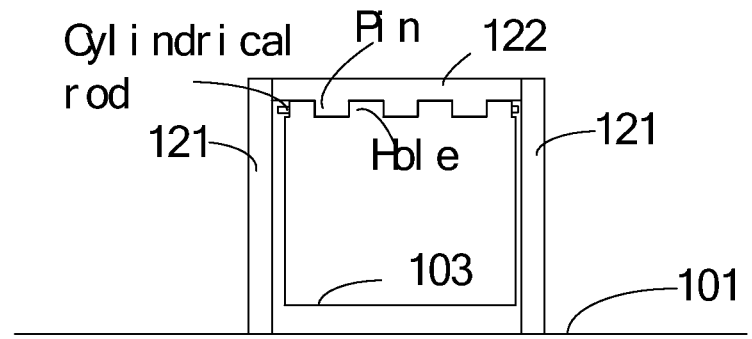
FIG. 4 is a schematic diagram showing another partial structure of the electronic device according to the first embodiment of the present invention.

The rotating plate 103 is a rectangular sheet, one end of the sheet is provided with a hole which may match the pin, as shown in FIG. 3. The hole of the rotating plate 103 is connected to the pin by a cylindrical rod as shown in FIG. 4. Thus, the rotating plate 103 is rotatable with respect to the cross arm 122.

Figure 5:
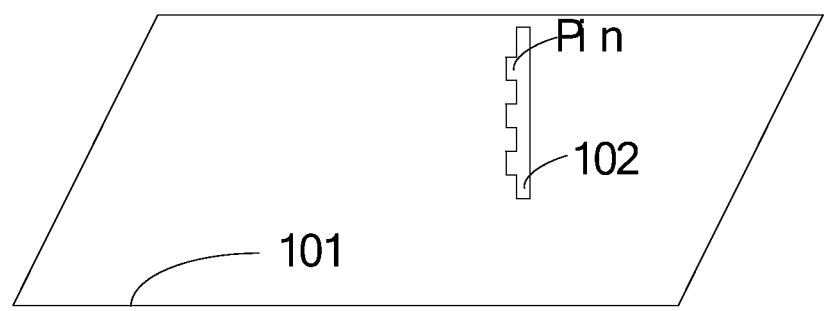
FIG. 5 is a schematic diagram showing another partial structure of the electronic device according to the first embodiment of the present invention.
Figure 6:
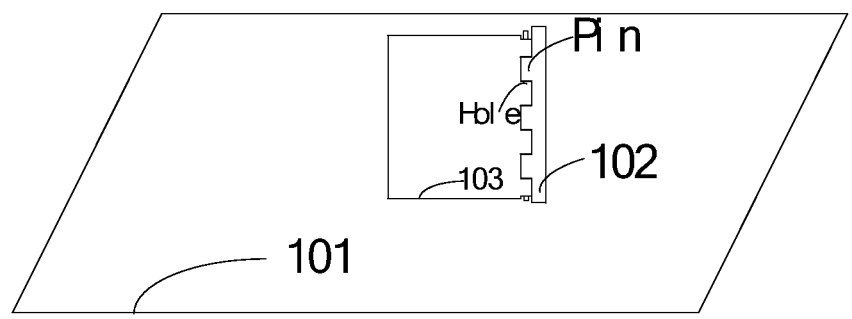
FIG. 6 is a schematic diagram showing another partial structure of the electronic device according to the first embodiment of the present invention.

Preferably, the support device 102 is a pillar provided with a pin as shown in FIG. 5, a hole provided in the rotating plate 103 is connected to the pin by a cylindrical rod as shown in FIG. 6. Thus, the rotating plate 103 is rotatable with respect to the support device 102 (rod).

Preferably, the support device 102 is a pillar with a top end of which provided with at least two holes, and an end of the rotating plate 103 is provided with at least one hole, and the above holes of the pillar and the hole of the rotating plate are connected in series by the cylindrical rod to make the rotating plate 103 articulated to the support device 102.

The driving device 104 is configured to drive the rotating plate 103 to rotate with respect to the support device 102.

The rotating plate 103 rotates with respect to the support device 102 to generate airflow; the airflow is in a direction parallel to a rotation plane of the rotating plate 103 and away from the support device 102.

The rotation plane of the rotating plate 103 is perpendicular to the support device 102, for example:

in the electronic device shown in FIG. 4, the rotation plane of the rotating plate 103 is perpendicular to the cross arm 122; and in the electronic device shown in FIG. 6, the rotation plane of the rotating plate 103 is perpendicular to the support device 102 (pillar).

It is to be noted that, when the rotating plate 103 rotates with respect to the support device connected with the rotating plate 103, airflow is generated at a distal end of the rotating plate 103 (i.e., a free end, specifically, the end connected to the support device 102 of the rotating plate 103 is an articulating end, and the free end is opposite to the articulating end), during the rotation of the rotating plate 103 with respect to the support device 102, the airflow is dispersed from the free end of the rotating plate 103 by flowing in a direction away from the support device 102.

The heat generating device 105 is arranged at a region that the airflow flows through. The heat of the heat generating device 105 is dissipated by the airflow.

Figure 7:
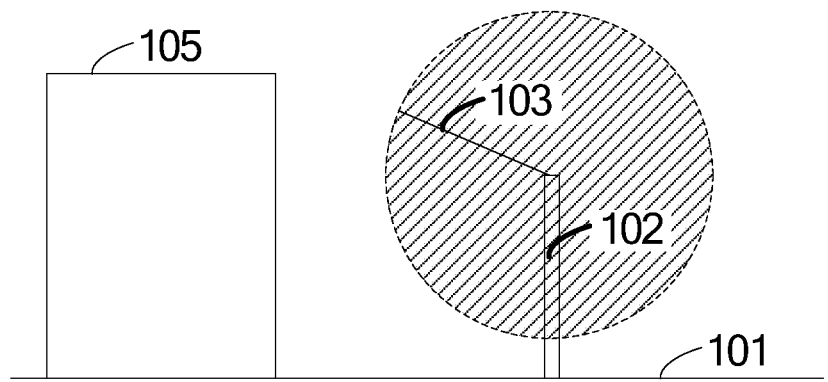
FIG. 7 is a schematic diagram showing another partial structure of the electronic device according to the first embodiment of the present invention.

It is to be noted that, the region that the airflow flows through includes an annular region where the support device 102 is taken as a center. Reference is made to FIG. 7, which is a schematic diagram of partial of the electronic device shown in FIG. 4 seen from a front view. The shaded region 701 shown by slashes in the Figure is a region passed by the rotating plate 103 when the rotating plate 103 rotates, the rest regions in FIG. 7 other than the shaded region 701 (an annular-shaped region or sector-shaped regions) are all a region 702 that the airflow flows through. Preferably, as shown in FIG. 7, the heat generating device 105 is arranged at the region 702 that the airflow flows through, i.e., the heat generating device 105 is located at a downstream of the airflow. The air surrounding the heat generating device 105 is driven to flow by the airflow that flows through the heat generating device 105, thus the heat of the heat generating device 105 is dissipated.

Figure 8:
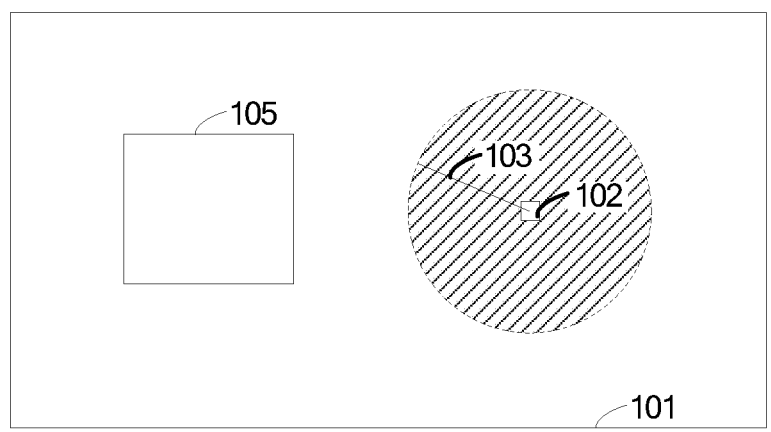
FIG. 8 is a schematic diagram showing another partial structure of the electronic device according to the first embodiment of the present invention.

Preferably, reference is made to FIG. 8, which is a top view based on the electronic device shown in FIG. 6. The shaded region 801 shown by slashes in the Figure is a region passed by the rotating plate 103 when the rotating plate 103 rotates, the rest regions in FIG. 8 other than the shaded region 801 (an annular-shaped region or sector-shaped regions) are all a region 802 that the airflow flows through. Preferably, as shown in FIG. 8, the heat generating device 105 is arranged at the region 802 that the airflow flows through, i.e., the heat generating device 105 is located at a downstream of the airflow. The air surrounding the heat generating device 105 is driven to flow by the airflow that flows through the heat generating device 105, thus the heat of the heat generating device 105 is dissipated.

As illustrated in the above solution, an electronic device according to a first embodiment of the present invention includes: a case; a support device arranged at the case; a rotating plate articulated to the support device, a driving device and a heat generating device. The driving device is configured to drive the rotating plate to rotate with respect to the support device. The rotating plate rotates with respect to the support device to generate airflow; the airflow is in a direction parallel to a rotation plane of the rotating plate and away from the support device. The heat generating device is arranged at a region that the airflow flows through. The heat of the heat generating device 105 is dissipated by the airflow. According to the present invention, the driving device is utilized to drive the rotating plate to rotate to push the air to flow to generate airflow, and the heat of the heat generating device is dissipated to the outside of the case along with the flowing of the air, thus the object to dissipate the heat of the heat generating device is achieved. Different from positive heat-dissipation devices such as fans, the device provided in the present invention is simpler, the effect of positive heat-dissipation is achieved via the airflow generated by the rotation (or swinging) of a metal sheet or film, and smaller energy is consumed. The device provided in the present invention is secure, reliable, and stable, and easily to meet the requirement of waterproofing and dustproofing. Meanwhile, compared to the requirement of the blade of the fan on the diameter dimension, the present invention is more flexible and effective in the use of space.

Figure 9:
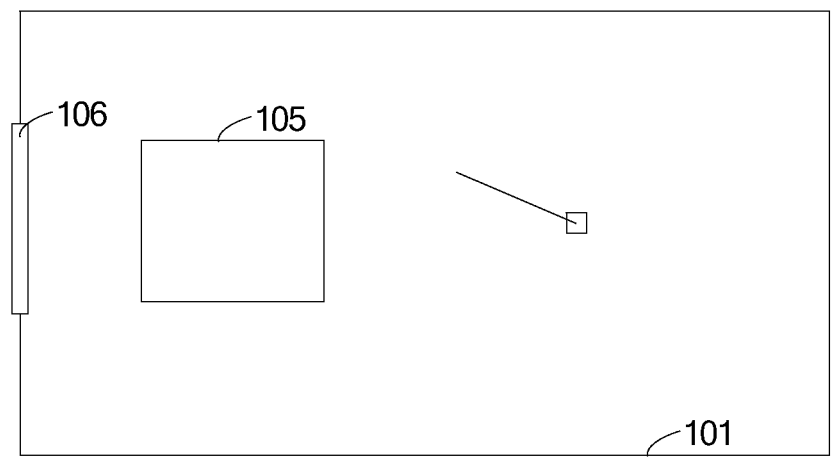
FIG. 9 is a schematic diagram showing the structure of an electronic device according to a second embodiment of the present invention.

Reference is made to FIG. 9, which shows a schematic diagram of partial structure of an electronic device according to a second embodiment of the present invention. Specifically, the electronic device further includes:

an opening 106 arranged at the case 101 and located at a downstream of the airflow that flows through the exothermal device 105, and configured to export the airflow that flows through the heat generating device 105 to the outside of the case 101.

It is to be noted that, the opening 106 may be set to a rectangular opening or a square opening.

Figure 10:
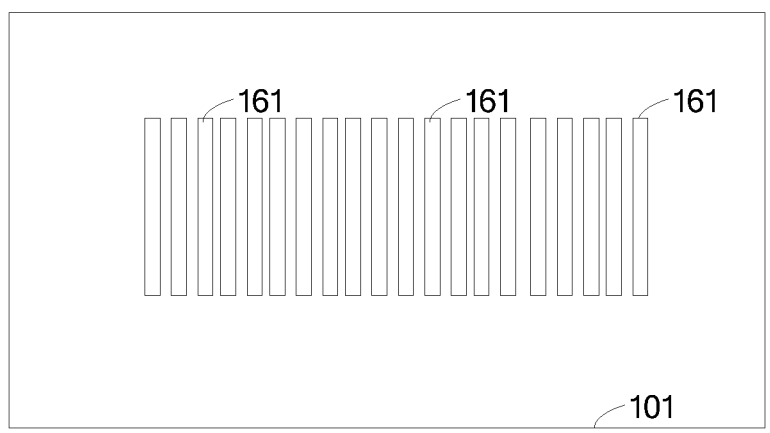
FIG. 10 is a schematic diagram showing another partial structure of the electronic device according to the second embodiment of the present invention.

Preferably, the opening 106 includes at least one strip-shaped opening, strip-shaped openings are distributed parallel to each other. As shown in FIG. 10, at a downstream of the airflow on the case 101, the opening 106 consists of a plurality of strip-shaped openings 161, and the strip-shaped openings 161 are parallel to each other.

Figure 11:
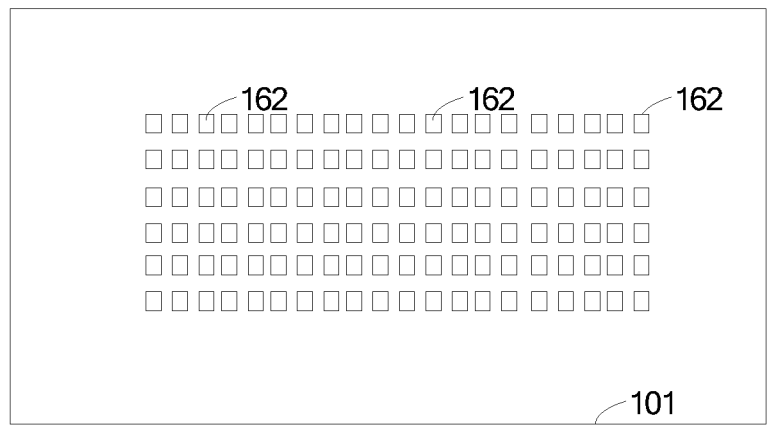
FIG. 11 is a schematic diagram showing another partial structure of the electronic device according to the second embodiment of the present invention.

Preferably, the opening 106 includes at least one tetragonum opening, and tetragonum openings are distributed evenly or at random. Preferably, the tetragonum opening includes a square opening and/or a rectangular opening. As shown in FIG. 11 for example, at a downstream of the airflow on the case 101, the opening 106 includes at least one square opening 162, square openings are distributed on the case 101 evenly.

Preferably, the present invention further provides a third embodiment, where, the heat generating device 105 includes:

a first heat transferring assembly connected to an electronic component via a second heat transferring assembly and configured to receive heat transferred by the second heat transferring assembly from the electronic component.

Figure 12:
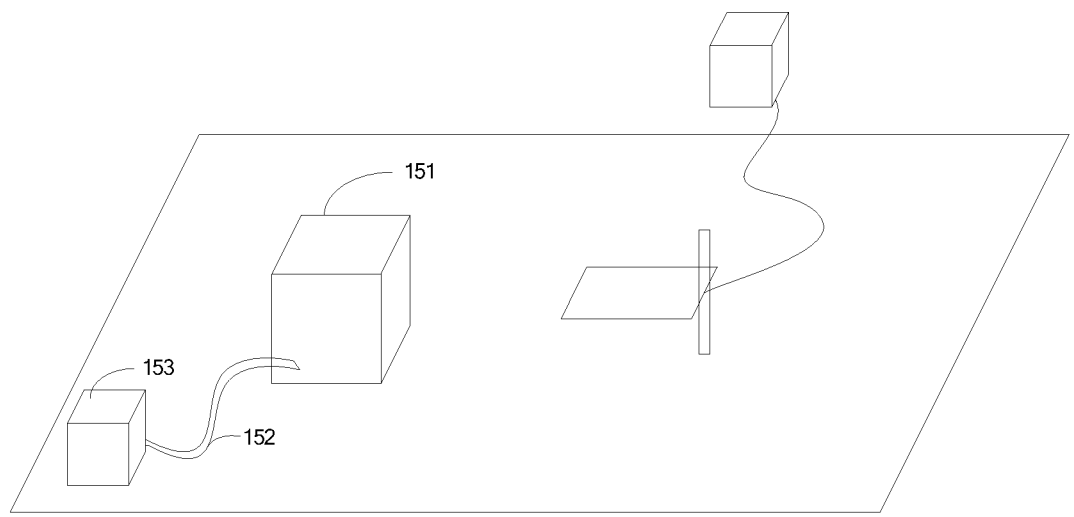
FIG. 12 is a schematic diagram showing the structure of an electronic device according to a third embodiment of the present invention.

Preferably, as shown in FIG. 12, a first heat transferring assembly 151 is connected to an electronic component 153 via a second heat transferring assembly 152 and configured to receive heat transferred by the second heat transferring assembly 152 from the electronic component 153. The first heat transferring assembly 151 includes a heat sink, and the second heat transferring assembly 152 includes a heat conductive pipe, the first heat transferring set 151 is connected to the second heat transferring assembly 152, and the second heat transferring assembly 152 is connected to the electronic component 153 which includes units such as a CPU that can generate heat.

Figure 13:
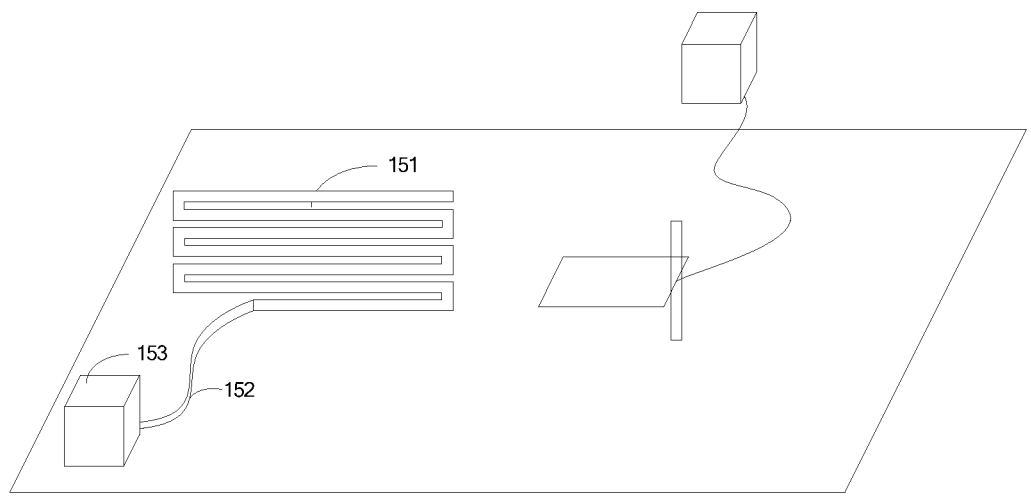
FIG. 13 is a schematic diagram showing another structure of the electronic device according to the third embodiment of the present invention.

Preferably, as shown in FIG. 13, the first heat transferring assembly 151 is connected to the electronic component 153 via the second heat transferring assembly 152 and configured to receive the heat transferred by the second heat transferring assembly 152 from the electronic component 153. The first heat transferring assembly 151 includes a heat conductive pipe configured in a reciprocation shape, and the second heat transferring assembly 152 includes a heat conductive pipe configured linearly. The first heat transferring assembly 151 is connected to the second heat transferring assembly 152, and the second heat transferring assembly 152 is connected to the electronic component 153 which includes units such as a CPU that can generate heat.

It is to be noted that, the first heat transferring assembly and the second heat transferring assembly may be integrated into the same component. As shown in FIG. 13, the heat conductive pipe of the first heat transferring assembly 151 and the heat conductive pipe of the second heat transferring assembly 152 may be made into the same heat conductive pipe, that is, the heat conductive pipe configured in a reciprocation shape and the heat conductive pipe configured linearly may be made the same heat conductive pipe. It may be understood as one heat conductive pipe with one end configured in a reciprocation shape and served as the first heat transferring assembly 151 and the other end configured linearly and served as the second heat transferring assembly 152. The heat conductive pipe configured in a reciprocation shape receives the heat transferred by the linearly configured heat conductive pipe 152 from an electronic component 153.

Preferably, the present invention further provides an electronic device according to a fourth embodiment, where, the driving device includes:

a swinging driver configured to drive the rotating plate to swing to and fro with respect to the support device by taking a predetermined axis as a central line.

The rotating plate swings to and fro to generate airflow, and the airflow is in a direction along the axis and away from the support device.

Figure 14:
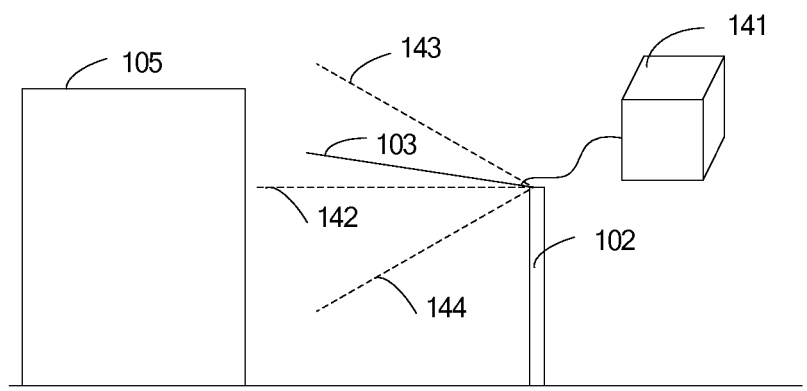
FIG. 14 is a schematic diagram showing the structure of an electronic device according to a fourth embodiment of the present invention.

Based on the electronic device as shown in FIG. 4, reference is made to FIG. 14, which is a schematic diagram of partial structure of this embodiment of the present invention.

As shown in the Figure, a swinging driver 141 is configured to drive the rotating plate 103 to swing to and fro with respect to the support device 102 by taking a predetermined axis 142 as a central line.

The rotating plate 103 swings to and fro to generate airflow, and the airflow flows through the heat generating device 105 in a direction along the axis 142 and away from the support device 102.

In FIG. 14, the range between a dashed line 143 and a dashed line 144 is the range of the swinging of the rotating plate 103, the airflow flows from the free end of the rotating plate 103 in a direction along the axis 142 and away from the support device 102.

As illustrated in the above solution, an electronic device according to a fourth embodiment of the present invention includes: a case, a support device arranged at the case; a rotating plate articulated to the support device, a driving device and a heat generating device. The driving device includes a swinging driver configured to drive the rotating plate to swing to and fro with respect to the support device by taking a predetermined axis as a central line. The rotating plate swings to and fro to generate airflow, and the airflow is in a direction along the axis and away from the support device. The heat generating device is arranged at a region that the airflow flows through and the heat of the heat generating device 105 is dissipated by the airflow. According to the present invention, the driving device is utilized to drive the rotating plate to rotate to push the air to flow to generate airflow, and the heat of the heat generating device is dissipated to the outside of the case along with the flowing of the air, thus the object to dissipate the heat of the heat generating device is achieved. Different from positive heat-dissipation devices such as fans, the device provided in the present invention is simpler, the effect of positive heat-dissipation is achieved via the airflow generated by the rotation (or swinging) of a metal sheet or film, and small energy is consumed. The device provided in the present invention is secure, reliable, and stable, and easily to meet the requirement of waterproofing and dustproofing. Meanwhile, compared to the requirement of the blade of the fan on the diameter dimension, the present invention is more flexible and effective in the use of space.

Figure 15:
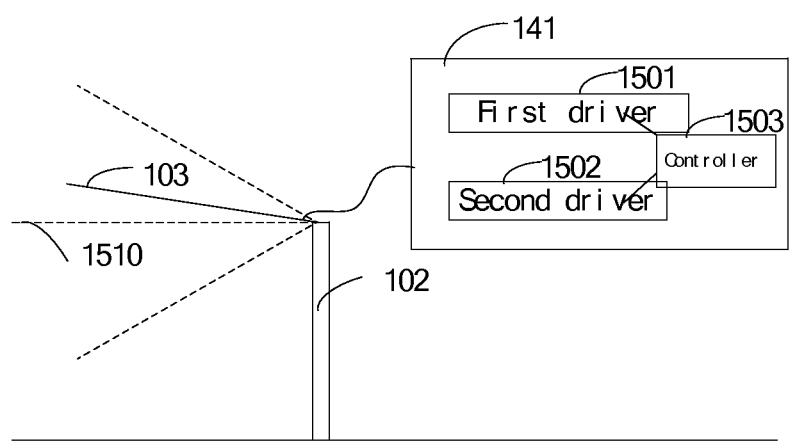
FIG. 15 is a schematic diagram showing partial structure of the electronic device according to the fourth embodiment of the present invention.

Preferably, reference is made to FIG. 15, which shows a schematic diagram of another structure of an electronic device according to this embodiment of the present invention, where the swinging driver 141 includes: a first driver 1501, a second driver 1502, and a controller 1503.

The first driver 1501 is configured to drive the rotating plate 103 to rotate with respect to the support device 102 by taking a predetermined axis 1510 as a central line in a first predetermined direction for a first predetermined duration.

As shown in FIG. 15, the first predetermined direction is the direction that the dashed line above the axis 1510 directs to the dashed line below the axis 1510, and the range of the swinging of the rotating plate 103 in the first predetermined duration is the range between the dashed line over the axis 1510 and the dashed line below the axis.

The second driver 1502 is configured to drive the rotating plate 103 to rotate with respect to the support device 102 by taking the predetermined axis 1510 as the central line in a direction opposite to the first predetermined direction for a second predetermined duration.

As shown in FIG. 15, the direction opposite to the first predetermined direction is the direction that the dashed line below the axis 1510 directs to the dashed line over the axis 1510, and the range of the swinging of the rotating plate 103 in the second predetermined duration is the range between the dashed line below the axis 1510 and the dashed line over the axis.

Preferably, the first predetermined duration is the same as the second predetermined duration.

The controller 1503 is configured to alternately trigger the first driver 1501 and the second driver 1502 to generate airflow.

The airflow is in a direction parallel to the axis 1510 and away from the support device 102.

It is to be noted that, alternately triggering of the first driver 1501 and the second driver 1502 by the controller 1503 includes:

the controller 1503, after triggering the first driver 1501 for a first predetermined duration, triggers the second driver 1502 for a second predetermined duration, after that, triggers the first controller 1501 for the first predetermined duration again, thus alternately triggering the first driver 1501 and the second driver 1502 in turn circularly. Thus, that the rotating plate 103 rotates with respect to the support device 102 in the first predetermined direction for the first predetermined duration, and rotates with respect to the support device 102 in a direction opposite to the first predetermined direction for the second predetermined duration is achieved, and thus the swinging of the rotating plate 103 with respect to the support device 102 to and fro is achieved and airflow is generated, the airflow flows through the heat generating device to dissipate the heat of the heat generating device.

Figure 16:
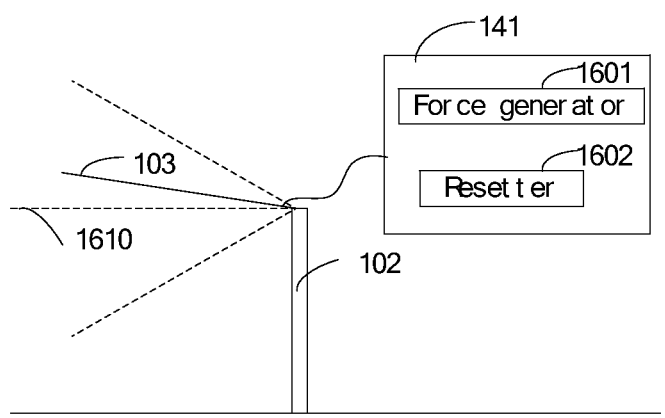
FIG. 16 is a schematic diagram showing another partial structure of the electronic device according to the fourth embodiment of the present invention.

Preferably, reference is made to FIG. 16, which is a schematic diagram of another partial structure of an electronic device according to this embodiment of the present invention, where the swinging driver 141 includes: a force generator 1601 and a resetting unit 1602.

The force generator 1601 is configured to generate an action force every a third predetermined duration, the action force controls the rotating plate 103 to rotate with respect to the support device 102 by taking a predetermined axis 1610 as a central line in a second predetermined direction for a fourth predetermined duration.

As shown in FIG. 16, the second predetermined direction is a direction that the dashed line above the axis 1610 directs to the dashed line below the axis 1610, and the range of the swinging of the rotating plate 103 in the fourth predetermined duration is the range between the dashed line over the axis 1610 and the dashed line below the axis.

The resetting unit 1602 is configured to control the rotating plate 103 to rotate with respect to the support device 102 by taking the predetermined axis 1610 as the central line in a direction opposite to the second predetermined direction.

Preferably, the resetting unit 1602 includes a spring.

As shown in FIG. 16, the direction opposite to the second predetermined direction is the direction that the dashed line below the axis 1610 directs to the dashed line over the axis 1610, and the range of the swinging of the rotating plate 103 in the third predetermined duration is the range of the swinging of the rotating plate 103 without being acted by an action force generated by the force generator 1601, e.g., the range between the dashed line below the axis 1610 and the dashed line over the axis.

Preferably, the third predetermined duration is the same as the fourth predetermined duration.

It is to be noted that, under the action of the action force generated by the force generator 1601, the rotating plate 103 swings downwards for the fourth duration, and when no action force acts, the rotating plate 103 swings upwards for the third duration, that the rotating plate 103 rotates with respect to the support device 102 in the second predetermined direction for the fourth predetermined duration, and rotates with respect to the support device 102 in a direction opposite to the second predetermined direction for the third predetermined duration is achieved, and thus the swinging of the rotating plate 103 with respect to the support device 102 to and fro is achieved, and airflow is generated. The airflow flows through the heat generating device to dissipate the heat of the heat generating device.

Figure 17:
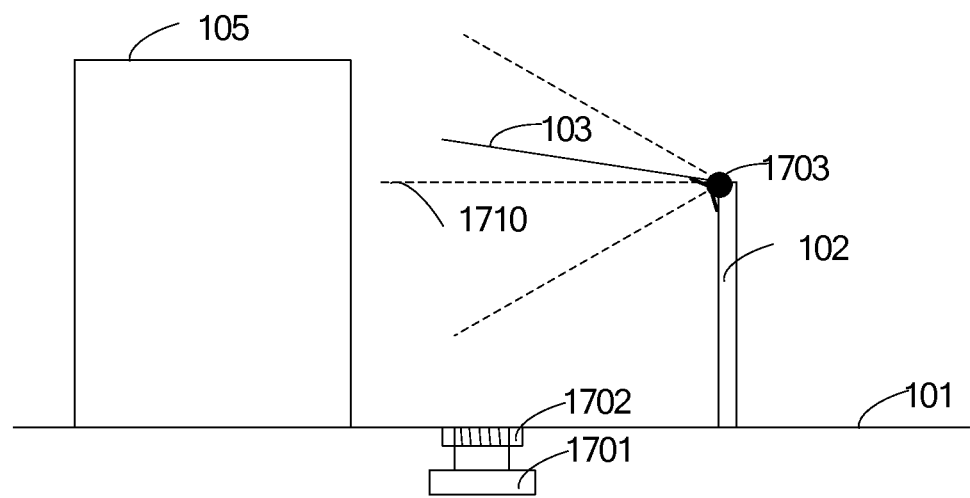
FIG. 17 is a schematic diagram showing the structure of an electronic device according to a fifth embodiment of the present invention.

Reference is made to FIG. 17, which is a schematic diagram showing the structure of an electronic device according to a fifth embodiment of the present invention, where the force generator includes: a pulse current generator 1701 and a core 1702.

The pulse current generator 1701 is configured to generate a pulse current every the third predetermined duration, and a duration of the pulse current is the fourth predetermined duration.

The core 1702 is wound at least one loop of winding, two leading-out terminals of the winding are respectively connected to the pulse current generator 1701, the core 1702 is configured to attract the rotating plate 103 to rotate with respect to the support device 102 every the third predetermined duration by taking a predetermined axis 1710 as a central line in the second predetermined direction for the fourth predetermined duration.

It is to be noted that, in this embodiment of the present invention, the rotating plate 103 is a metal plate, and may also be a film with its free end being provided with metal that can be attracted by a magnet.

Preferably, the core 1702 includes at least an iron rod, and each of the iron rod is wound by at least one loop of winding, two leading-out terminals of the winding are respectively connected to positive and negative poles of the pulse current generator 1701 according to an electric connecting rule to increase the attraction of the core 1702.

As shown in FIG. 17, the second predetermined direction is the direction that the dashed line above the axis 1710 directs to the dashed line below the axis 1710, and the range of the swinging of the rotating plate 103 in the fourth predetermined duration is the range between the dashed line over the axis 1710 and the dashed line below the axis.

The resetting unit includes a torsional spring 1703 configured to pull the rotating plate 103 to rotate with respect to the support device 102 by taking the predetermined axis 1710 as the central line in a direction opposite to the second predetermined direction.

And the direction opposite to the second predetermined direction is the direction that the dashed line below the axis 1710 directs to the dashed line over the axis 1710, and the range of the swingion of the rotating plate 103 in the third predetermined duration is the range of the swingion of the rotating plate 103 without being acted by an action force generated by the core 1702, e.g., the range between the dashed line below the axis 1710 and the dashed line over the axis.

It is to be noted that, one end of the torsional spring 1703 resists against a side of the rotating plate 103 facing the case 101, the other end of the torsional spring 1703 resists against a side of the support device 102 facing the heat generating device 105, thereby being capable of pulling the rotating plate 103 to rotate with respect to the support device 102 by taking the predetermined axis 1710 as the central line in the direction opposite to the second predetermined direction.

Figure 18:
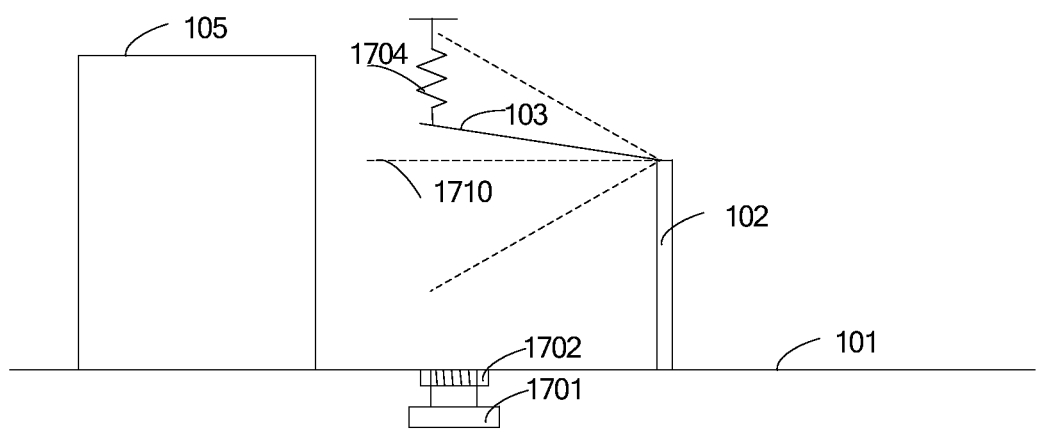
FIG. 18 is a schematic diagram showing another structure of the electronic device according to the fifth embodiment of the present invention.

Preferably, the resetting unit includes a spring 1704 arranged at a position opposite to that of the core 1702 as shown in FIG. 18 and configured to pull the rotating plate 103 to rotate with respect to the support device 102 by taking the predetermined axis 1710 as the central line in the direction opposite to the second predetermined direction.

It is to be noted that, one end of the spring 1704 is arranged at a position opposite to that of the core 1702, the other end of the spring 1704 is connected to the free end of the rotating plate 103. An elastic force of the spring 1704 is smaller than the action force generated by the core 1702 in the fourth predetermined duration, thus the core 1702 is able to attract the rotating plate 103 to rotate with respect to the support device 102 by taking the predetermined axis 1710 as the central line in the second predetermined direction for the fourth predetermined duration. When the core 1702 does not generate an action force to attract the rotating plate 103, the spring 1704 pulls the rotating plate 103 to rotate with respect to the support device 102 by taking the predetermined axis 1710 as the central line in the direction opposite to the second predetermined direction, thus the swing of the rotating plate 103 with respect to the support device 102 to and fro is achieved and airflow is generated. The airflow flows through the heat generating device to dissipate the heat of the heat generating device.

Figure 19:
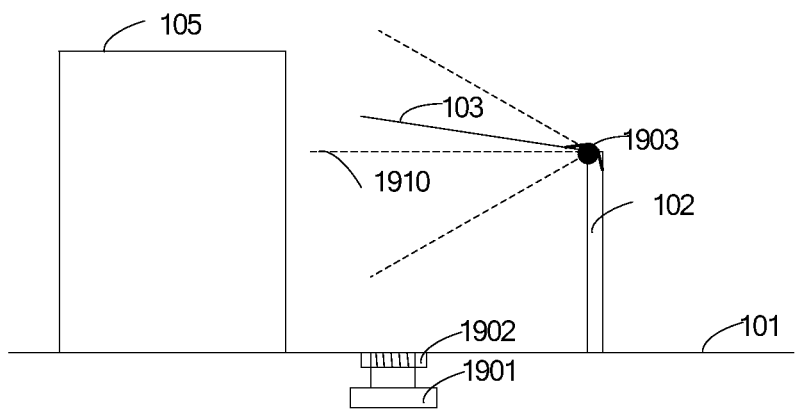
FIG. 19 is a schematic diagram showing the structure of an electronic device according to a sixth embodiment of the present invention.

Reference is made to FIG. 19, which shows a schematic diagram of the structure of an electronic device according to a sixth embodiment of the present invention, where the force generator includes: a pulse current generator 1901 and a core 1902.

The pulse current generator 1901 is configured to generate a pulse current every the third predetermined duration, and a duration of the pulse current is the fourth predetermined duration;

The core 1902 is wound at least one loop of winding, two leading-out terminals of the winding are respectively connected with the pulse current generator, the core 1902 is configured to push the rotating plate 103 to rotate with respect to the support device 102 every the third predetermined duration by taking a predetermined axis 1910 as a central line in the second predetermined direction for the fourth predetermined duration.

It is to be noted that, in this embodiment of the present invention, the rotating plate 103 is a film with its free end being provided with a magnet that is repelled to the action force generated by the core 1902.

Preferably, the core 1902 includes at least one iron rod, and each iron rod is wound at least one loop of winding, two leading-out terminals of the winding are respectively connected to positive and negative poles of the pulse current generator 1901 according to an electric connecting rule to thereby increasing the repelling force of the core 1902.

As shown in FIG. 19, the second predetermined direction is the direction that the dashed line below the axis 1910 directs to the dashed line over the axis 1910, and the range of the swinging of the rotating plate 103 in the fourth predetermined duration is the range between the dashed line below the axis 1910 and the dashed line over the axis.

The resetting unit includes a torsional spring 1903 configured to pull the rotating plate 103 to rotate with respect to the support device 102 by taking the predetermined axis 1910 as the central line in a direction opposite to the second predetermined direction.

The direction opposite to the second predetermined direction is the direction that the dashed line overt the axis 1910 directs to the dashed line below the axis 1910, and the range of the swinging of the rotating plate 103 in the third predetermined duration is the range of the swinging of the rotating plate 103 without being acted by an action force generated by the core 1902, e.g., the range between the dashed line over the axis 1910 and the dashed line below the axis.

It is to be noted that, one end of the torsional spring 1903 resists against a side of the rotating plate 103 back to the case 101, the other end of the torsional spring 1903 resists against a side of the support device 102 back to the heat generating device 105, thereby being capable of pulling the rotating plate 103 to rotate with respect to the support device 102 by taking the predetermined axis 1910 as the central line in the direction opposite to the second predetermined direction.

Optionally, after being pushed by the core 1902 to rotate with respect to the support device 102 every the third predetermined duration by taking a predetermined axis 1910 as a central line in the second predetermined direction for the fourth predetermined duration, the rotating plate 103 may fall down to rotate with respect to the support device 102 by taking the predetermined axis 1910 as the central line in the direction opposite to the second predetermined direction due to the gravity without the torsional spring 1903.

Figure 20:
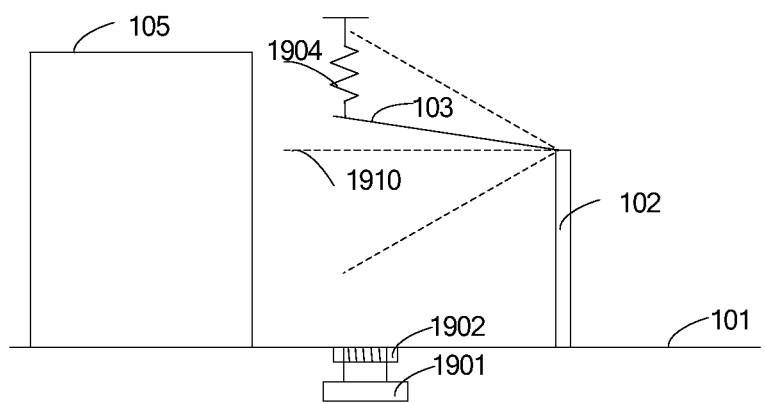
FIG. 20 is a schematic diagram showing another structure of the electronic device according to the sixth embodiment of the present invention.

Preferably, the resetting unit includes a torsional spring 1904 arranged at a position opposite to that of the core 1902 as shown in FIG. 20 and configured to push the rotating plate 103 to rotate with respect to the support device 102 by taking the predetermined axis 1910 as the central line in the direction opposite to the second predetermined direction.

It is to be noted that, one end of the spring 1904 is arranged at a position opposite to that of the core 1902, the other end of the spring 1904 is connected to the free end of the rotating plate 103. An elastic force of the spring 1904 is smaller than the action force generated by the core 1902 in the fourth predetermined duration, thus the core 1902 is able to push the rotating plate 103 to rotate with respect to the support device 102 by taking the predetermined axis 1910 as the central line in the second predetermined direction for the fourth predetermined duration. When the core 1902 does not generate an action force to push the rotating plate 103, the spring 1904 pushes the rotating plate 103 to rotate with respect to the support device 102 by taking the predetermined axis 1910 as a central line in a direction opposite to the second predetermined direction, thus the swinging of the rotating plate 103 with respect to the support device 102 to and fro is achieved and airflow is generated, the airflow flows through the heat generating device to dissipate the heat of the heat generating device.

Figure 21:
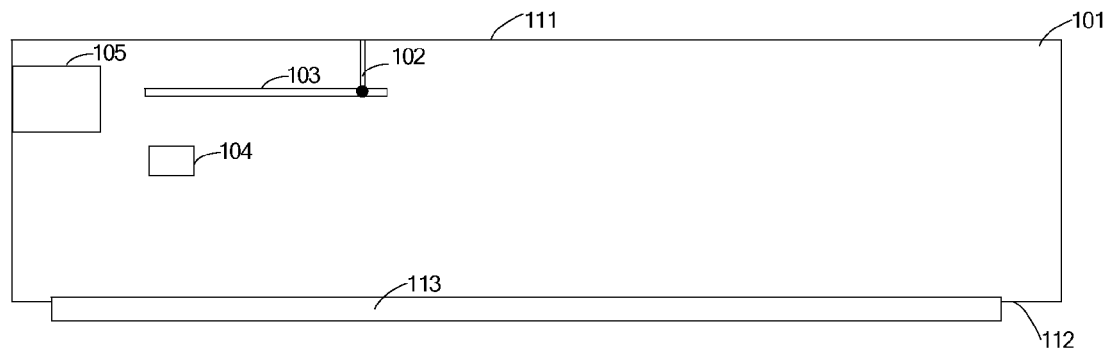
FIG. 21 is a schematic diagram showing the structure of an electronic device according to a seventh embodiment of the present invention.

Reference is made to FIG. 21, which shows a schematic diagram of the structure of an electronic device according to a seventh embodiment of the present invention. The case 101 includes a first surface 111 and a second surface 112, and the first surface 111 is opposite to the second surface 112, an input and output device 113 is arranged at the second surface 112.

The support device 102 is arranged at the first surface 111 of the case 101.

The input and output device 113 includes an image output unit, a voice output unit, an input unit or the like. The rotating plate 103 is articulated to the support device 102, and the driving device 104 drives the rotating plate 103 to rotate with respect to the support device 102.

The rotating plate 103 rotates with respect to the support device 102 to generate airflow, and the airflow is in a direction parallel to a rotation plane of the rotating plate 103 and away from the support device 102. The heat generating device 105 is arranged at a region that the airflow flows through and the heat of the heat generating device 105 is dissipated by the airflow.

For example, the electronic device is a handheld device such as a cellphone, the support device 102 is arranged at the back of the handheld device, i.e., a side opposite to the input and output device 113.

Preferably, the present invention further provides an electronic device according to an eighth embodiment.

The support device is arranged at a predetermined area on the first surface of the case, and the predetermined area is opposite to the area where the voice output unit of the input and output device is located.

Figure 22:
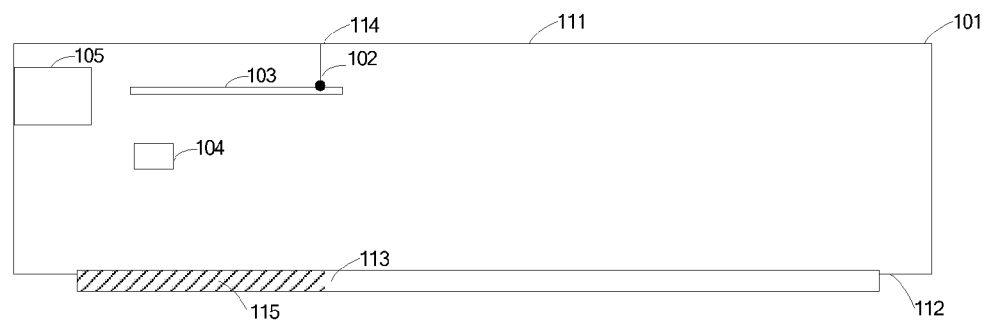
FIG. 22 is a schematic diagram showing the structure of an electronic device according to an eighth embodiment of the present invention.

As shown in FIG. 22, the case 101 includes a first surface 111 and a second surface 112, and the first surface 111 is opposite to the second surface 112, the input and output device 113 is arranged at the second surface 112.

The support device 102 is arranged at a predetermined area 114 on the first surface 111 of the case 101, and the predetermined area 114 is opposite to the area 115 where the voice output unit of the input and output device 113 is located.

The input and output device 113 include an image output unit, a voice output unit, an input unit or the like. The rotating plate 103 is articulated to the support device 102, and the driving device 104 drives the rotating plate 103 to rotate with respect to the support device 102.

The rotating plate 103 rotates with respect to the support device 102 to generate airflow, the airflow is in a direction parallel to a rotation plane of the rotating plate 103 and away from the support device 102. The heat generating device 105 is arranged in a region that the airflow flows through and is the heat of the heat generating device 105 is dissipated by the airflow.

Preferably, the electronic device is a handheld device, and the second surface is a surface where devices such as a display screen, a keyboard and an earpiece of the handheld device are located. An area (predetermined area 114) opposite to the area 115 where the voice output unit of the input and output device 113 is located is a back surface of the handheld device, and is a non-handheld area by the hand of the user, the non-handheld area is a non-skin directly-contacting area when the user uses the handheld device.

As illustrated in the above solution, when uses the electronic device according to this embodiment of the present invention, the user does not directly contact the heat-dissipation device (including such as the support device or the heat generating device) in the electronic device, thus in addition to ensuring the heat-dissipation of the heat generating device in the electronic device, the using by the user is ensured not being affected, the utilization of the space is more effective, and the user experience is improved.

Preferably, the present invention further provides an electronic device according to a ninth embodiment, where the electronic device further includes: an opening 2301.

The opening 2301 is arranged at the case 101, and is located at a downstream of airflow that flows through the exothermal device, and is configured to export the airflow that flows through the heat generating device to the outside of the case 101.

Preferably, the opening 2301 is arranged at a lateral side of the case 101 by which the first surface and the second surface are connected.

Figure 23:
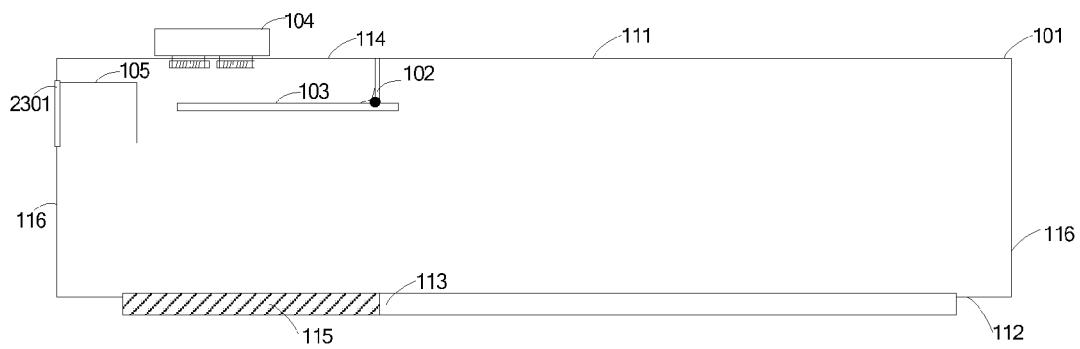
FIG. 23 is a schematic diagram showing the structure of an electronic device according to a ninth embodiment of the present invention.

As shown in FIG. 23, in this embodiment of the present invention, the case 101 includes a first surface 111 and a second surface 112, and the first surface 111 is opposite to the second surface 112, an input and output device is arranged at the second surface 112. The support device 102 is arranged at the first surface 111 of the case 101, and at a predetermined area 114 on the first surface 111 of the case 101. The predetermined area 114 is opposite to the area 115 where a voice output unit of the input and output device is located.

The opening 2301 is arranged at a side 116 by which the first surface 111 and the second surface 112 are connected.

Preferably, as shown in FIG. 23, the opening 2301 is arranged at a lateral side of the case 101 nearest to the area 115 where the voice output unit is located and the predetermined area 114.

Preferably, the driving device 104 includes a pulse current generator, a core wound a winding and a torsional spring, as shown in FIG. 23.

Preferably, the opening 2301 includes at least one strip-shaped opening, the strip-shaped openings are distributed on the lateral side.

Preferably, the opening 2301 includes at least one tetragonum opening, and tetragonum openings are distributed evenly or at random. Preferably, the tetragonum opening includes a square opening and/or a rectangular opening.

For example, at a downstream of the airflow in the case 101, the opening 2301 includes at least one square opening, and square openings are distributed on the lateral side of the case 101 evenly.

Figure 24:
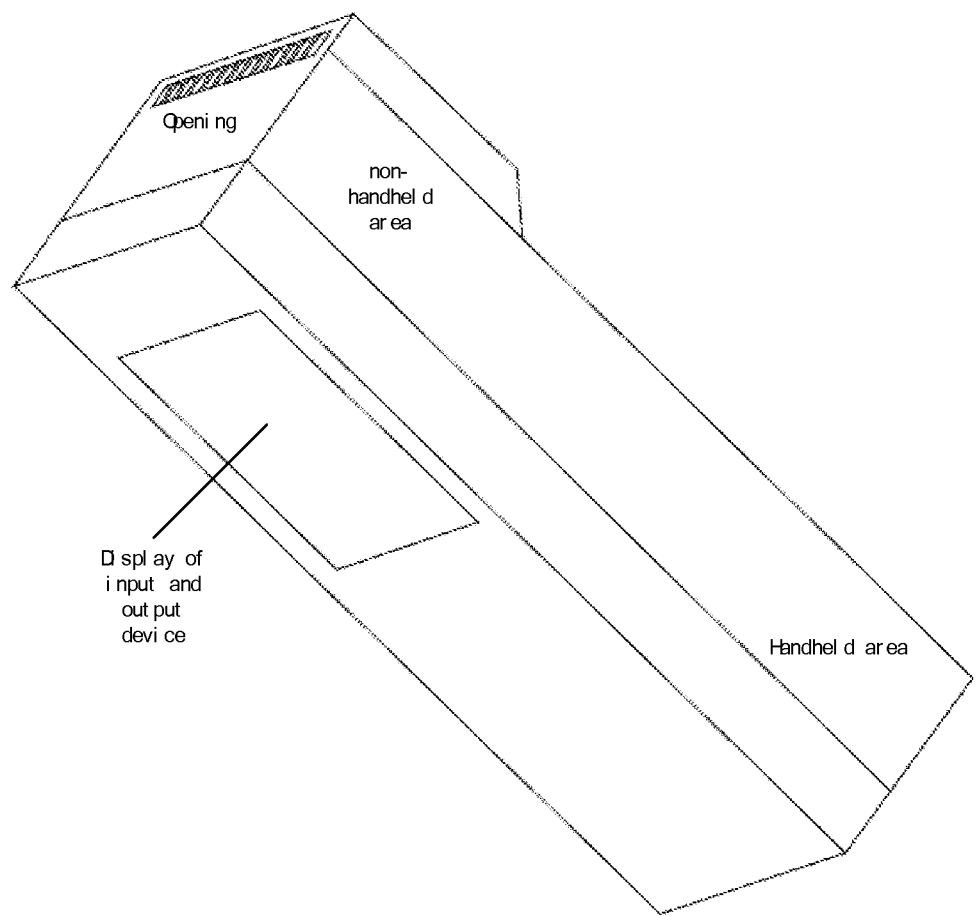
FIG. 24 is a stereo diagram showing the structure of the electronic device according to the ninth embodiment of the present invention.

FIG. 24 is a stereo diagram of this embodiment of the present invention, the handheld area is an area directly contacted by the user when the user uses the electronic device and the non-handheld area is an area of the electronic device exposed when the user uses the electronic device.

Each of the support device, rotating plate, driving device and heat generating device of the electronic device is arranged inside the electronic device, and the opening is arranged at the non-handheld area.

The above embodiments are described in a progressive manner. Each of the embodiments is mainly focused on describing its differences from other embodiments, and references may be made among these embodiments with respect to the same or similar portions among these embodiments. For the devices provided in the embodiments, i.e., the electronic device according to embodiments of the present invention, since they are corresponding to the method that is named in the same way in the embodiments, the description of which is simpler, reference may be made to the explanation of the method part for the related portions.

An electronic device according to the present invention is described in detail hereinbefore. Based on the above description of the disclosed embodiments, the person skilled in the art is capable of carrying out or using the present invention. It is obvious for the person skilled in the art to make many modifications to these embodiments. The general principle defined herein may be applied to other embodiments without departing from the spirit or scope of the present invention. Therefore, the present invention is not limited to the embodiments illustrated herein, but should be defined by the broadest scope consistent with the principle and novel features disclosed herein.

The invention claimed is:

1. An electronic apparatus, comprising:
   a case;
   a support device arranged at the case;
   a rotating plate articulated to the support device;
   a driving device configured to drive the rotating plate to rotate with respect to the support device; wherein the rotating plate rotates with respect to the support device to generate airflow, the airflow is in a direction parallel to a rotation plane of the rotating plate and away from the support device; and
   a heat generating device arranged at a region that the airflow flows through; wherein heat of the heat generating device is dissipated by the airflow,
   wherein the driving device comprises:
      a swinging driver configured to drive the rotating plate to swing to and fro with respect to the support device by taking a predetermined axis as a central line; and
      the rotating plate swings to and fro to generate airflow, and the airflow is in a direction along the predetermined axis and away from the support device,
   wherein the swinging driver comprises:
      a force generator configured to generate an action force every action duration, wherein the action force controls the rotating plate to rotate with respect to the support device by taking the predetermined axis as the central line in a turning direction for a turning duration; and
      a resetting unit configured to control the rotating plate to rotate with respect to the support device by taking the predetermined axis as the central line in a direction opposite to the turning direction,
   wherein the resetting unit comprises a torsional spring, one end of the torsional spring resists against a side of the rotating plate facing the case, the other end of the torsional spring resists against a side of the support device facing the heat generating device; or
   wherein the resetting unit comprises a torsional spring, one end of the torsional spring resists against a side of the rotating plate back to the case, and the other end of the torsional spring resists against a side of the support device back to the heat generating device.

2. The electronic apparatus according to claim 1, wherein the force generator comprises:
   a pulse current generator configured to generate a pulse current every the action duration, and wherein a duration of the pulse current is the turning duration; and
   a core wound at least one loop of winding, wherein two leading-out terminals of the winding are respectively connected to the pulse current generator, the core is configured to attract the rotating plate to rotate with respect to the support device every the action duration by taking the predetermined axis as the central line in the turning direction for the turning duration,
   wherein the torsional spring is configured to pull the rotating plate to rotate with respect to the support device by taking the predetermined axis as the central line in the direction opposite to the turning direction.

3. The electronic apparatus according to claim 1, wherein the force generator comprises:
   a pulse current generator configured to generate a pulse current every the action duration, and wherein a duration of the pulse current is the turning duration; and
   a core wound at least one loop of winding, wherein two leading-out terminals of the winding are respectively connected to the pulse current generator, the core is configured to push the rotating plate to rotate with respect to the support device every the action duration by taking the predetermined axis as the central line in the turning direction for the turning duration,
   wherein the torsional spring is configured to push the rotating plate to rotate with respect to the support device by taking the predetermined axis as the central line in the direction opposite to the turning direction.

4. The electronic apparatus according to claim 1, wherein the force generator comprises:
   a pulse current generator configured to generate a pulse current every the action duration, and wherein a duration of the pulse current is the turning duration; and
   a core wound at least one loop of winding, wherein two leading-out terminals of the winding are respectively connected to the pulse current generator, the core is configured to push the rotating plate to rotate with respect to the support device every the action duration by taking the predetermined axis as the central line in the turning direction for the turning duration,
   wherein the rotating plate falls down to rotate with respect to the support device by taking the predetermined axis as the central line in the direction opposite to the turning direction due to a gravity after being pushed by the core to rotate with respect to the support device every the action duration by taking a predetermined axis as the central line in the turning direction for the turning duration.

* * * * *